United States Patent
Siemieniec et al.

(10) Patent No.: US 9,431,499 B2
(45) Date of Patent: Aug. 30, 2016

(54) METHOD OF MANUFACTURING A STRESS-CONTROLLED HEMT

(71) Applicant: Infineon Technologies Austria AG, Villach (AT)

(72) Inventors: Ralf Siemieniec, Villach (AT); Gilberto Curatola, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/711,167

(22) Filed: May 13, 2015

(65) Prior Publication Data
US 2015/0255573 A1 Sep. 10, 2015

Related U.S. Application Data

(62) Division of application No. 13/540,711, filed on Jul. 3, 2012, now Pat. No. 9,147,740.

(51) Int. Cl.
*H01L 21/338* (2006.01)
*H01L 29/423* (2006.01)
*H01L 29/778* (2006.01)
*H01L 29/10* (2006.01)
*H01L 21/28* (2006.01)
*H01L 21/285* (2006.01)
(Continued)

(52) U.S. Cl.
CPC ... *H01L 29/42372* (2013.01); *H01L 21/28247* (2013.01); *H01L 21/28581* (2013.01); *H01L 29/1054* (2013.01); *H01L 29/1075* (2013.01); *H01L 29/66462* (2013.01); *H01L 29/7787* (2013.01); *H01L 29/84* (2013.01)

(58) Field of Classification Search
CPC .......... H01L 29/2003; H01L 29/7787; H01L 29/66462; H01L 29/66431; H01L 21/28581; H01L 21/28247
USPC .......................... 438/172, 50, 104
See application file for complete search history.

(56) References Cited

U.S. PATENT DOCUMENTS

2008/0017867 A1 1/2008 Spring
2008/0283870 A1 11/2008 Sato
(Continued)

FOREIGN PATENT DOCUMENTS

CN 102280494 A 12/2011

OTHER PUBLICATIONS

Ambacher, et al., "Two-dimensional Electron Gases Introduced by Spontaneous and Piezoelectric Polarization Charges in N- and Ga-face AlGaN/Gan Heterostructures," Journal of Applied Physics, vol. 85, No. 6, Mar. 15, 1999, American Institute of Physics, pp. 3222-3233.

(Continued)

*Primary Examiner* — Thien F Tran
(74) *Attorney, Agent, or Firm* — Murphy, Bilak & Homiller, PLLC

(57) ABSTRACT

A method of manufacturing a semiconductor device includes providing a heterostructure body with a first doped region, a second doped region spaced apart from the first doped region and a two-dimensional charge carrier gas channel between the first and second doped regions, and forming a gate structure on the heterostructure body for controlling the channel, the gate structure comprising a piezoelectric material and an electrical conductor in contact with the piezoelectric material.

15 Claims, 7 Drawing Sheets

(51) Int. Cl.
*H01L 29/66* (2006.01)
*H01L 29/84* (2006.01)

(56) References Cited

U.S. PATENT DOCUMENTS

2009/0127977 A1    5/2009   So et al.
2011/0233538 A1*   9/2011   Iwakami ............. H01L 29/1029
                                                                257/43
2012/0280278 A1   11/2012   Curatola et al.

OTHER PUBLICATIONS

Fan, et al., "Zinc Oxide Nanostructures: Synthesis and Properties," Journal of Nanoscience and Nanotechnology, 2005.

Wasa, et al., "Fundamentals of Thin Film Piezoelectric Materials and Processing Design for a Better Energy Harvesting MEMS," PowerMEMS Conf. 2009, Washington DC, USA.

Yu, et al., "Spontaneous and piezoelectric polarization effects in III-V nitride heterostructures.", J. Vac. Sci. Technol. B, vol. 17, No. 4, Jul./Aug. 1999.

* cited by examiner

METHOD OF MANUFACTURING A STRESS-CONTROLLED HEMT

TECHNICAL FIELD

The instant application relates to high electron mobility transistors (HEMTs), and more particularly to stress-controlled HEMTs.

BACKGROUND

High electron mobility transistors (HEMTs) based on gallium nitride (GaN) are used for power and radio-frequency applications. An HEMT has a two-dimensional electron gas (2DEG) which forms in the GaN layer near the interface with an AlGaN barrier where electrons have a very high mobility. The 2DEG forms because of two basic principles: (1) charge due to spontaneous polarization of the GaN layer and (2) piezoelectric polarization due to the lattice mismatch between the GaN and AlGaN layers. The Al content and thickness of the AlGaN layer determine the extent of piezoelectric polarization.

HEMTs are typically normally-on devices because of the automatic formation of the 2DEG. However, power devices are usually implemented as normally-off devices. To be normally-off, the 2DEG of an HEMT must be interrupted between the source and drain of the device. One way to realize a normally-off HEMT is to recess the gate into the AlGaN barrier layer, extinguishing the 2DEG under the recessed region. While such a structure yields a normally-off structure, the recess process must be precisely controlled e.g. in the order of only 1 nm. Otherwise a large spread in the threshold voltage results due to a variable thickness of the AlGaN layer under the gate. In addition, the gate must be isolated from the AlGaN material to avoid large gate leakage which can result from the lowered gate Schottky barrier. The recessed gate structure also yields a relatively low threshold voltage which is undesirable for power applications.

Another way to realize a normally-off HEMT is to form the gate from p-doped GaN material. A normally-off HEMT with a p-doped GaN gate typically has a threshold voltage of about 1.5V, but the AlGaN barrier must be thin and have low Al content which negatively affects the on-resistance due to the reduced carrier density in the 2DEG. These limitations arise because of difficulties associated with realizing high doping densities in p-doped GaN and limitations associated with efficiently depleting a 2DEG channel via p-type semiconductor material (even assuming an ideally highly doped p-type layer). Other disadvantages of a normally-off HEMT with a p-doped GaN gate include lowered transconductance and limited gate voltage since the p-doped gate forms a pn-junction which begins to conduct at a relatively low positive gate voltage of about 5 to 6V.

A normally-off HEMT can also be realized by implanting fluorine into the 2DEG channel region. Such a structure has a threshold voltage of about 1V, but there are unsolved technological issues with this approach such as the stability of the implanted species, temperature dependency and aging. Other approaches may be used to manufacture a normally-off HEMT. In each case, an electric field is used to control the 2DEG channel.

SUMMARY

According to one embodiment of a transistor device, the transistor device comprises a heterostructure body including a source, a drain spaced apart from the source and a two-dimensional charge carrier gas channel between the source and the drain. The transistor device further comprises a piezoelectric gate on the heterostructure body. The piezoelectric gate is operable to control the channel below the piezoelectric gate by increasing or decreasing a force applied to the heterostructure body responsive to a voltage applied to the piezoelectric gate. The transistor device can be normally-on or normally-off.

According to an embodiment of a semiconductor device, the semiconductor device comprises a heterostructure body, a first doped region in the heterostructure body, a second doped region spaced apart from the first doped region in the heterostructure body, and a two-dimensional charge carrier gas channel in the heterostructure body between the first and second doped regions. The semiconductor device further comprises a gate structure for controlling the channel. The gate structure comprises a piezoelectric material and an electrical conductor in contact with the piezoelectric material.

According to an embodiment of a method of manufacturing a semiconductor device, the method comprises: providing a heterostructure body with a first doped region, a second doped region spaced apart from the first doped region and a two-dimensional charge carrier gas channel between the first and second doped regions; and forming a gate structure on the heterostructure body for controlling the channel, the gate structure comprising a piezoelectric material and an electrical conductor in contact with the piezoelectric material.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

The embodiments described herein relate to heterostructure field effect transistors (HFETs). The term HFET is also commonly referred to as HEMT (high electron mobility transistor), MODFET (modulation-doped FET) or MESFET (metal semiconductor field effect transistor). The terms heterostructure semiconductor device, transistor device, HFET, HEMT, MESFET and MODFET are used interchangeably herein to refer to a field effect transistor incorporating a junction between two materials with different band gaps (i.e. a heterojunction) which forms the device channel. For example, GaN may be combined with AlGaN, GaN may be combined with InGaN, etc. Also, transistors may have AlInN/AlN/GaN barrier/spacer/buffer layer structures. Still other III-V combinations are possible.

In general, the channel of the heterostructure semiconductor device is controlled below the gate region of the device by stress rather than an electric field. To this end, a force is imparted on the heterostructure semiconductor device by a piezoelectric material which functions as a gate of the device. This force counteracts or increases a built-in stress in the heterostructure body, controlling the channel. The built-in stress in the heterostructure body is present because of lattice mismatch between different materials of the heterostructure body.

For example to realize a normally-off device, the piezoelectric gate counteracts the built-in lattice mismatch stress when no voltage is applied across the gate. This in turn disrupts (depletes) the channel below the piezoelectric gate. The piezoelectric gate supports or increases the built-in stress when a voltage is applied to the gate to switch the device on. A normally-on device can be realized in the opposite manner i.e. the piezoelectric gate imparts no or minimal force on the heterostructure body when no voltage is applied across the gate and counteracts or increases the built-in stress when a voltage is applied to the gate. In each case, the conductive channel region below the piezoelectric gate is not controlled by an electric field even though a control voltage is applied to the gate. Instead, the channel is controlled by inducing stress in the heterostructure body through a force generated by the piezoelectric gate.

Figure 1:
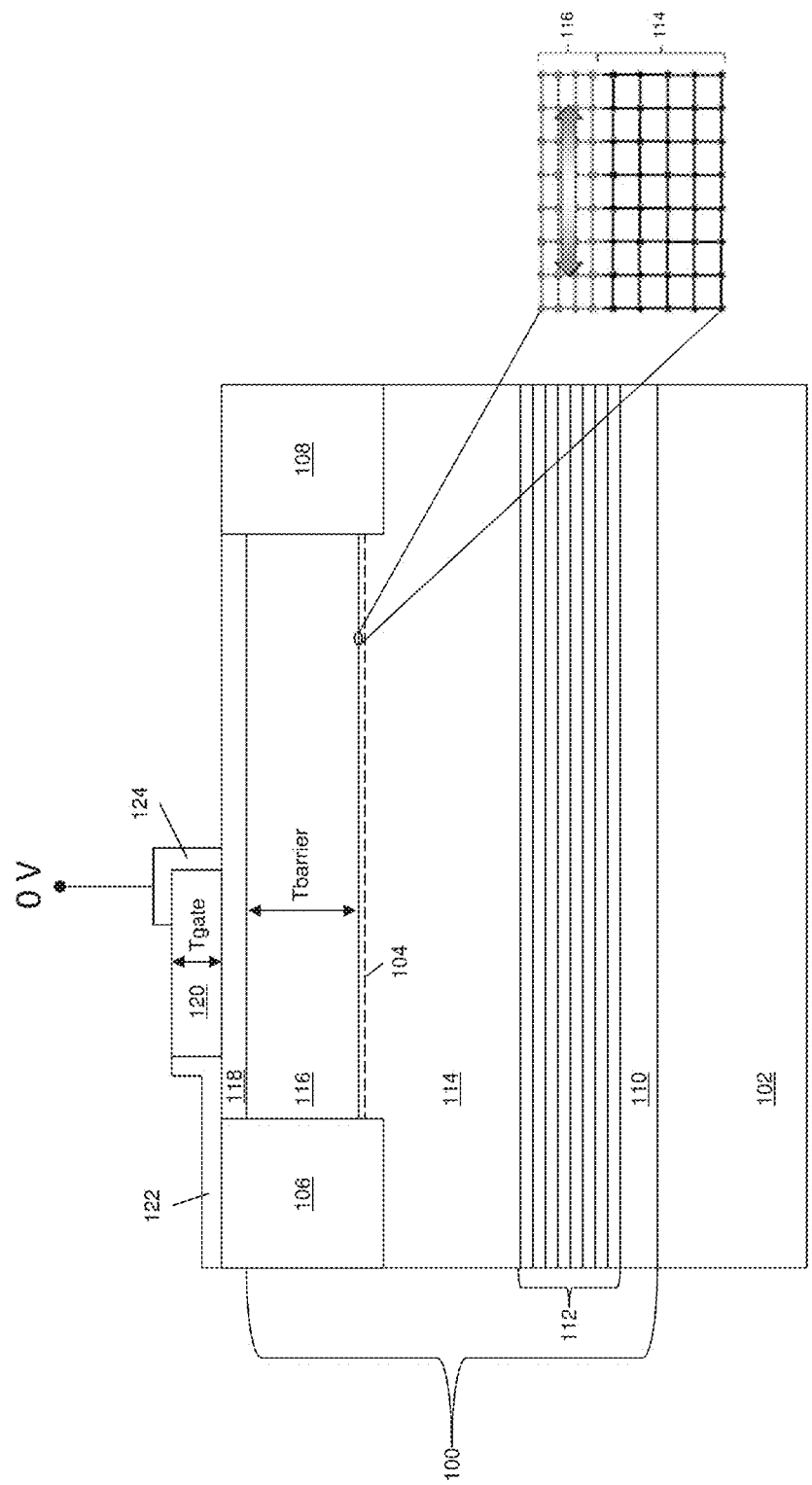
FIGS. 1-4 illustrate cross-sectional views of an embodiment of a stress-controlled heterostructure semiconductor device under different normally-on and normally-off configurations.

FIG. 1 illustrates a cross-sectional view of an embodiment of an HFET which includes a heterostructure body 100 disposed on a substrate 102. The heterostructure body 100 includes a two-dimensional charge carrier gas 104 between a source 106 and a drain 108 of the device. The source 106 and drain 108 can be formed by doping the heterostructure body 100 or any other appropriate conventional technique.

In one embodiment, the HFET is a GaN-based HEMT and the heterostructure body 100 includes a nucleation layer 110, a plurality of transition layers 112 on the nucleation layer 106, a GaN buffer layer 114 on the transition layers 112, and a GaN alloy barrier layer 116 on the GaN buffer layer 114. The barrier layer 116 may comprise any suitable GaN alloy such as AlGaN, InAlN, AlN, InAlGaN, etc. The source 106 of the HFET extends through the GaN alloy barrier layer 116 into the GaN buffer layer 114. The drain 108 of the HFET is spaced apart from the source 106 and also extends through the GaN alloy barrier layer 116 into the GaN buffer layer 114. In this embodiment, the substrate 102 is a silicon substrate. In other embodiments, a different substrate 102 is used such as a sapphire or SiC substrate. The nucleation layer 106 and the transition layers 112 may have different structures or even be omitted depending on the type of substrate 102 used.

In general with GaN technology, GaN-based heterostructures can be grown along the c-direction (i.e., the Ga-face) or along the N-face e.g. for GaN/AlGaN heterostructures. The face type of a GaN-based device determines the location of the two-dimensional charge carrier gas, and the percentage of aluminum (Al) determines the charge density in AlGaN/GaN HEMTs. There is a direct relationship between the concentration of Al in the GaN alloy barrier layer 116 to sheet charge density at the barrier/buffer interface because AlGaN and other GaN alloys have a different lattice constant than GaN and in-plane biaxial stress is created when a GaN alloy is grown on GaN. The biaxial stress in the GaN alloy barrier layer 116 is represented by the horizontal line with end arrows in the exploded view shown in FIG. 1, which shows the lattice in a region at the interface between the GaN alloy barrier layer 116 and the GaN buffer layer 114. The GaN buffer layer 114 can be considered unstrained because the buffer layer 114 is considerably thicker than the barrier layer 116. GaN and its compounds have high piezoelectric properties that result in measurable electric fields in the mega-Volts per centimeter range. These high electric fields effect conductivity, allowing for electron (or hole) transport without using dopants.

The presence of these polarization charges and strain effects result in the two-dimensional charge carrier gas channel 104 which forms an electron or hole inversion layer characterized by very high carrier density and carrier mobility. A thin e.g. 1-2 nm AlN layer can be provided between the GaN buffer layer 114 and the GaN alloy barrier layer 116 to minimize alloy scattering and enhance 2DEG mobility. Other compound semiconductor technologies which yield a two-dimensional electron or hole gas can also be used. In each case, polarization charges are used to form the two-dimensional charge carrier gas channel 104 of the HFET. Other combinations of III-V semiconductor materials can be used to realize a 2DEG or 2DHG (two-dimensional hole gas) channel 104 in the buffer layer 114 as is well known in the art. For example, HEMT structures where the channel is induced only due to spontaneous polarization can also be used. There is no mismatch between the GaN and top layer for these devices. This is the case when InAlN is used instead of AlGaN. Also, the source 106 and the drain 108 may be contacted at the same surface of the heterostructure body 100 as shown in FIG. 1. Alternatively, the source 106 and/or the drain 108 can be electrically contacted at the backside of the structure through a corresponding conductive via (not shown) extending from the source 106 and/or the drain 108 to the backside e.g. which can be metallized and/or a highly doped substrate 102 such as an n+Si, n+SiC or native GaN substrate.

The source 106 and the drain 108 both laterally contact the two-dimensional charge carrier gas channel 104. The HFET can be normally-on meaning that the HFET operates in depletion mode, or normally-off meaning that the HFET operates in enhancement mode. In either case, a surface passivation layer 118 is formed on the heterostructure body 100. In one embodiment, the surface passivation layer 118 comprises Si3N4, Al2O3, SiO2, HfO2, or ZrO2.

Figure 7:
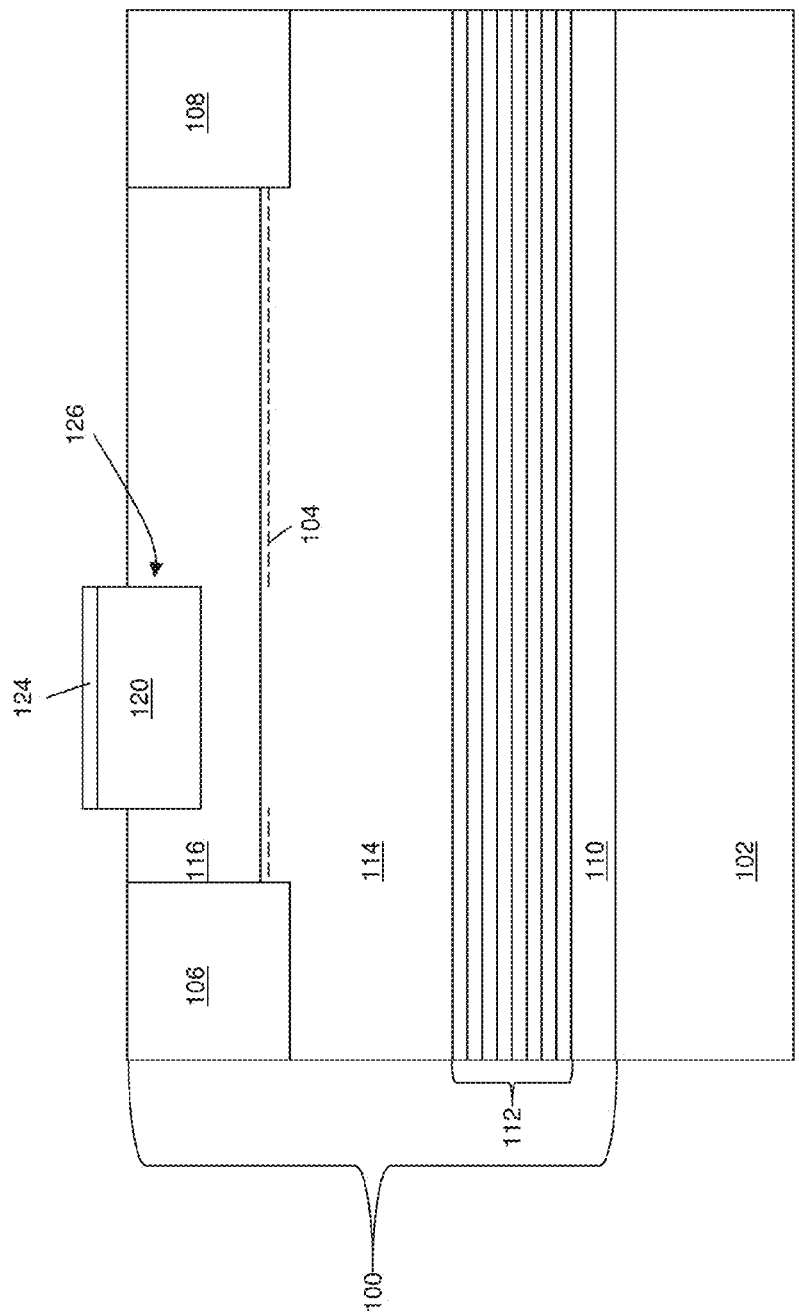
FIG. 7 illustrates a cross-sectional view of still another embodiment of a stress-controlled heterostructure semiconductor device.

A piezoelectric gate 120 is also formed on the heterostructure body 100 for controlling the channel 104 below the gate 120. The piezoelectric gate 120 controls the channel 104 by increasing or decreasing a force applied to the heterostructure body 100 responsive to a voltage (V) applied to the gate 120. The force generated by the piezoelectric gate 120 imparts stress in the GaN alloy barrier layer 116, counteracting or increasing the built-in lattice mismatch stress in the barrier layer 116. To realize such a structure, piezoelectric materials are used which can be deposited as thin layers. For example, a thin film zinc oxide or a thin film piezoelectric ternary compound such as Pb(Zr,Ti)O3 can be deposited to form the piezoelectric gate 120. In one embodiment, the GaN alloy barrier layer 116 is an AlGaN layer having a thickness (Tbarrier) under the piezoelectric gate 120 of at least 10 nm and the piezoelectric gate 120 has a thickness (Tgate) of 100 nm or less. In other embodiments, the GaN alloy barrier layer 116 can be thinner e.g. if the GaN alloy barrier layer 116 is recessed under the piezoelectric gate 120 as shown in FIG. 7. The piezoelectric gate 120 can be thicker than 100 nm in other embodiments. In general, the thicknesses of the GaN alloy barrier layer 116 and piezoelectric gate 120 can be selected to help set the threshold voltage of the device.

Figure 2:
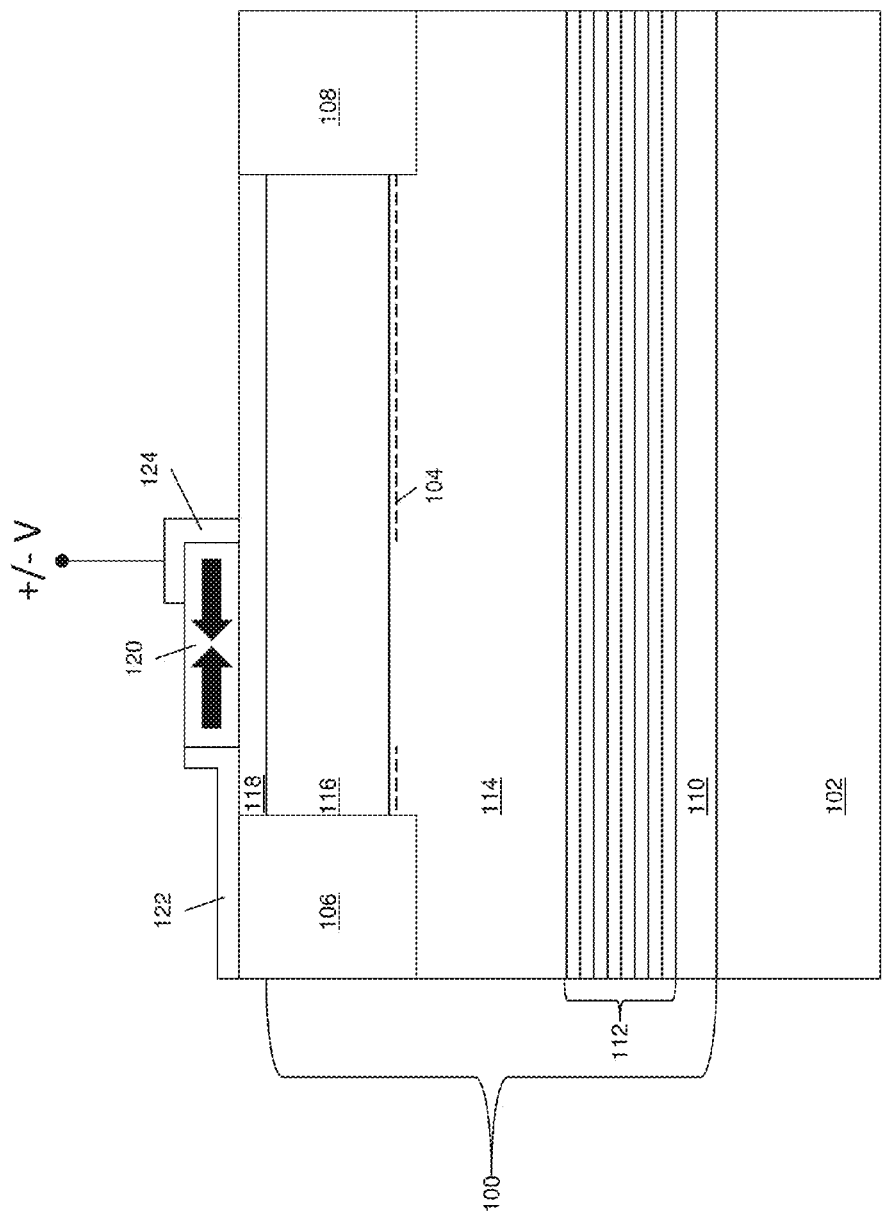

FIG. 1 shows the piezoelectric gate 120 with no applied voltage (0 V) and the channel 104 uninterrupted below the gate 120. The HFET is normally-on according to this embodiment. The HFET is normally-on because the piezoelectric gate 120 applies little or no force to the underlying passivation layer 118 absent a voltage applied to the gate 120, and hence the channel 104 remains uninterrupted under the gate 120. When a voltage (+/−V) is applied to the piezoelectric gate 120 as shown in FIG. 2, the gate 120 generates a compressive or tensile force in response which is applied to the passivation layer 118. The force is indicated by inwardly facing arrows in FIG. 2. The direction of the force depends on the orientation of the piezoelectric gate 120. For example, the force can run parallel or perpendicular to the electric field applied to the gate 120 depending on the orientation of the gate 120.

The passivation layer 118 is thin enough to transfer enough of the force to the underlying GaN alloy barrier layer 118, counteracting or increasing the built-in stress in the barrier layer 118. Particularly, the crystal dipoles in the GaN alloy barrier layer 118 move laterally responsive to the applied force. For a compressive force, the crystal dipoles move laterally toward one another. The crystal dipoles move laterally away from one another under a tensile force. In either case, the carrier density in the channel 104 is affected by the force-induced stress. Application of a sufficiently large voltage across the piezoelectric gate 120 results in a high enough force being transferred to the GaN alloy barrier layer 116 through the passivation layer 118 so that the resulting stress completely depletes (disrupts) the channel 104 under the gate 120 as represented by the break in the dashed line representing the channel 104 in FIG. 2.

Figure 3:
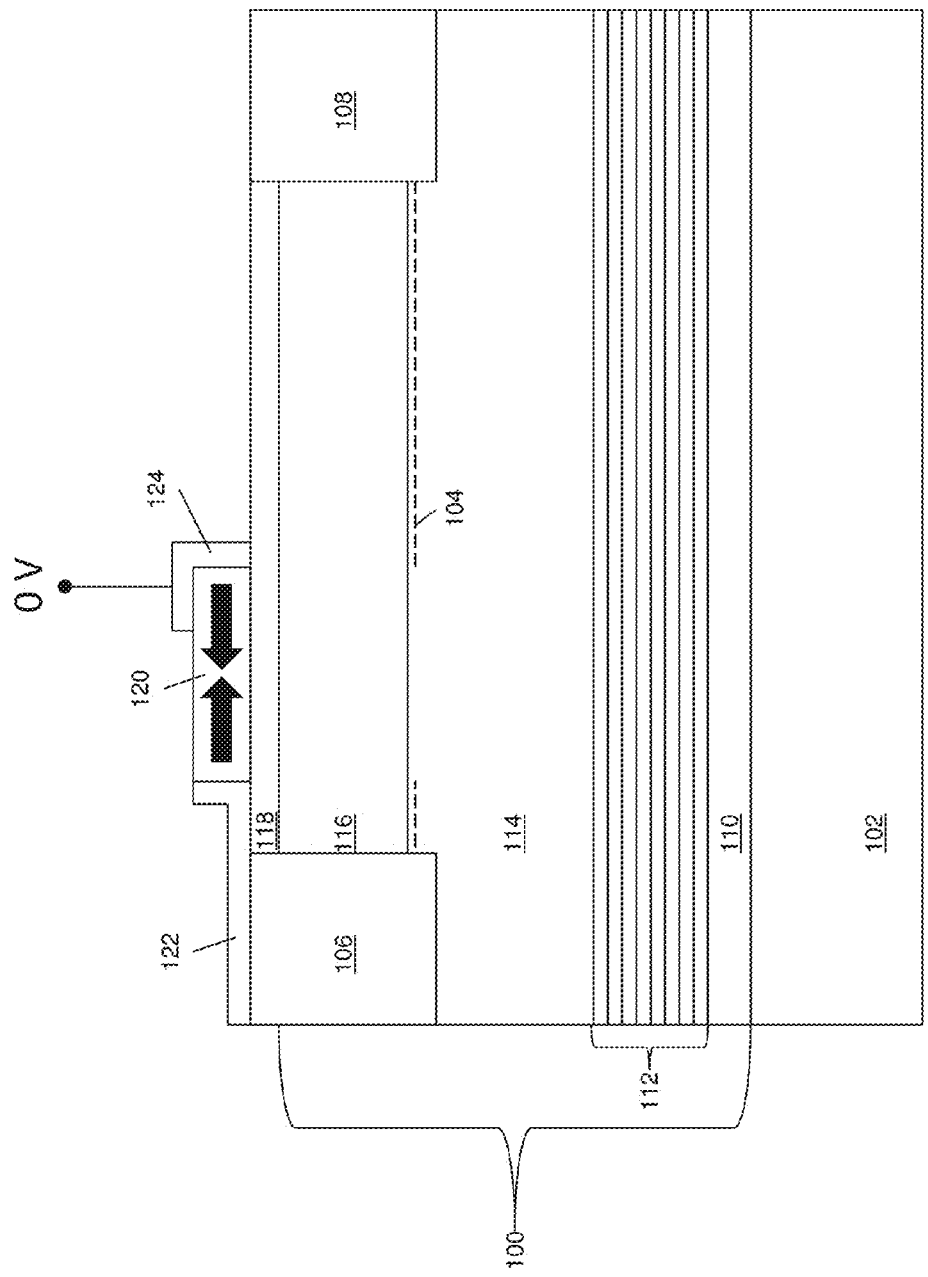
Figure 4:
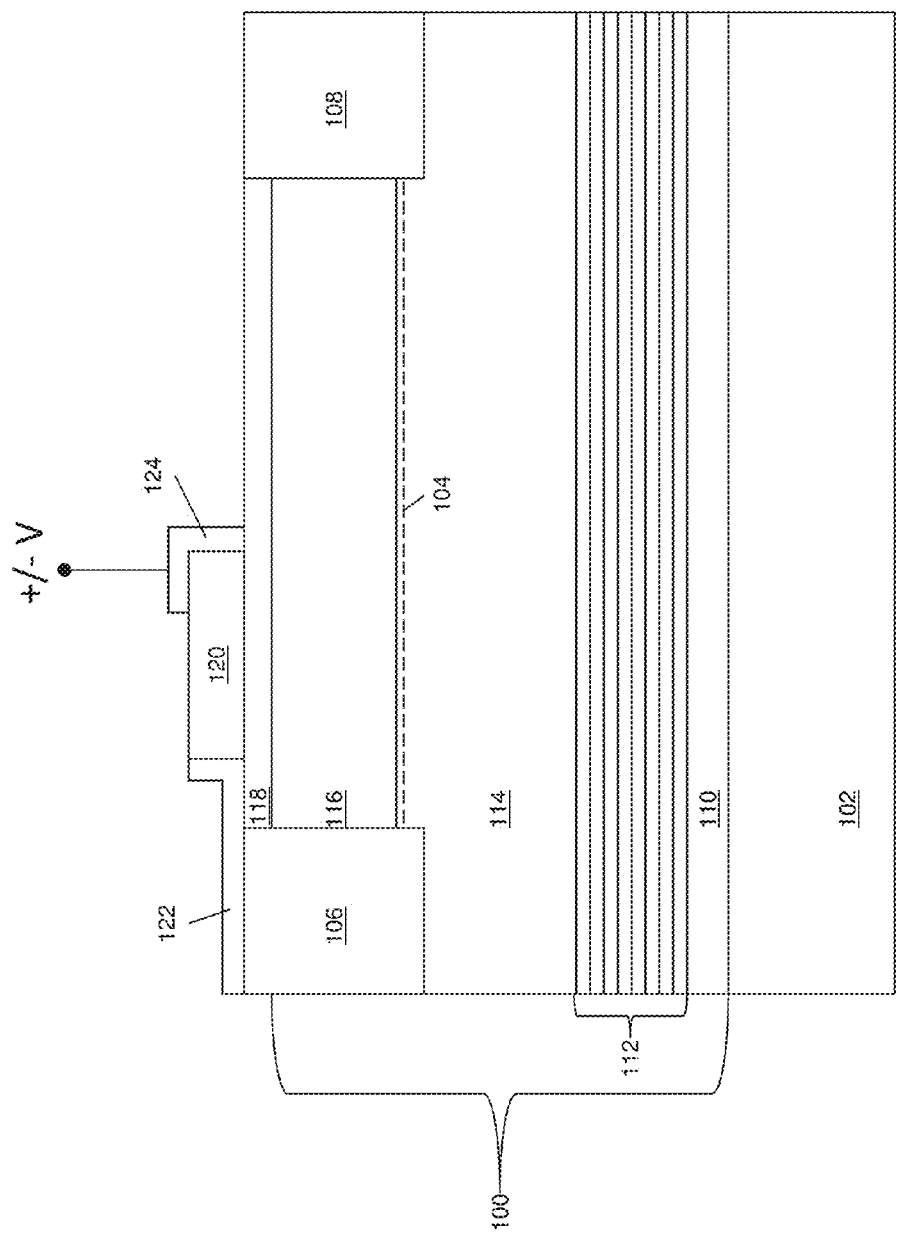

FIG. 3 shows a cross-sectional view of the HFET of FIG. 1, however the piezoelectric gate 120 counteracts the built-in stress in the GaN alloy layer 116 so that the channel 104 is disrupted below the gate 120 absent a voltage (0 V) applied to the gate 120. That is, the orientation of the piezoelectric gate 120 is such that the gate 120 imparts a force on the underlying GaN alloy barrier layer 116 without an electric field applied to the gate 120. The force is indicated by inwardly facing arrows in FIG. 3. The HFET is normally-off according to this embodiment. The channel 104 can be re-established by applying a suitable voltage (+/−V) to the piezoelectric gate 120 as shown in FIG. 4, causing the piezoelectric gate 120 to change the amount of force applied to the GaN alloy barrier layer 116 through the passivation layer 118 so that the carrier density in the channel 104 increases and the channel 104 reestablishes under the gate 120.

In general, the piezoelectric gate 120 is formed on the heterostructure body 100 with an orientation that either counteracts (normally-off) or supports (normally-on) the built-in stress in the GaN alloy barrier layer 116 absent a voltage applied to the gate 120. When a voltage is applied to the piezoelectric gate 120, the gate 120 generates an increasing or decreasing force which when applied to the heterostructure body 100 complements or counteracts the built-in stress in the GaN alloy barrier layer 116. This way, the HFET can be made normally-on or normally-off and the channel 104 can be controlled via stress imparted by the force generated by the piezoelectric gate 120. In each of these embodiments, the threshold voltage of the device is decoupled from electrical parameters and instead controlled by the properties of the piezoelectric gate material and the thickness of the layers below the gate 120 and of the HEMT structure.

In addition, a thin passivation layer 118 can be interposed between the piezoelectric gate 120 and the heterostructure body 100 as shown in FIG. 1-4. As explained above, the 2DEG or 2DHG channel 104 is formed by spontaneous and piezoelectric polarization effects. Since the polarization dipole is insufficient to generate a high density 2DEG/2DHG alone, a positive sheet charge on the surface of the GaN alloy barrier layer 116 may be needed which should be caused by the piezoelectric polarization only. However, additional charges can be present at the surface which originate from ionized states at the surface of the device. As a consequence, providing the passivation layer 118 between the heterostructure body 100 and the piezoelectric gate 120 can avoid the formation of such states that would otherwise lead to charge trapping and de-trapping effects and to a shift of the device characteristics. Furthermore, the control voltage (V) need not be applied across a gate dielectric leading to a vertical electrical field to control the channel 104 which has consequences for the minimum and maximum possible thickness of the gate dielectric. Instead, the control voltage is applied across the piezoelectric gate 120 which is disposed on top of the passivation layer 118 according to the embodiments shown in FIGS. 1-4.

Further according to the embodiments shown in FIG. 1-4, the piezoelectric gate material is electrically contacted on both lateral sides. One side of the gate 120 is electrically connected with the source 106 through a first electrical conductor 122. At the opposing side, contact to the piezoelectric gate 120 is made by a gate electrode 124. This way, the gate 120 can be controlled in relation to the source potential according to these embodiments.

Figure 5:
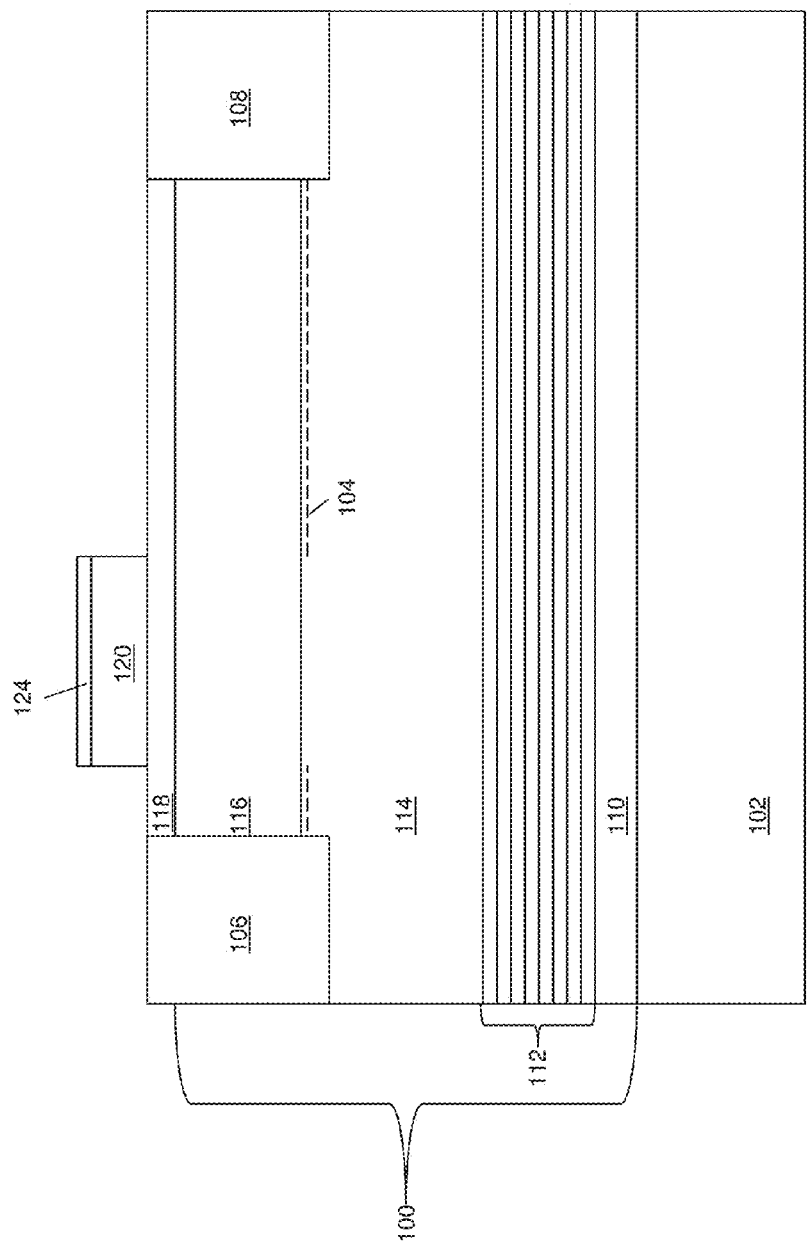
FIG. 5 illustrates a cross-sectional view of another embodiment of a stress-controlled heterostructure semiconductor device.

FIG. 5 illustrates a cross-sectional view of an embodiment of an HFET which is similar to the embodiment shown in FIG. 1, however the gate electrode 124 is formed only on the top side of the piezoelectric gate 120 facing away from the heterostructure body 100. The gate voltage (V) used to alter the status of the piezoelectric gate 120 is therefore applied only to the top side of the gate 120 instead of the lateral sides as shown in FIGS. 1-4. In each case, an electric field builds up either vertically or horizontally across the piezoelectric gate 120 which causes the gate 120 to expand or contract laterally. The resulting compressive or tensile force is applied to the underlying heterostructure body 100 through the intermediary passivation layer 118 as previously described herein.

Figure 6:
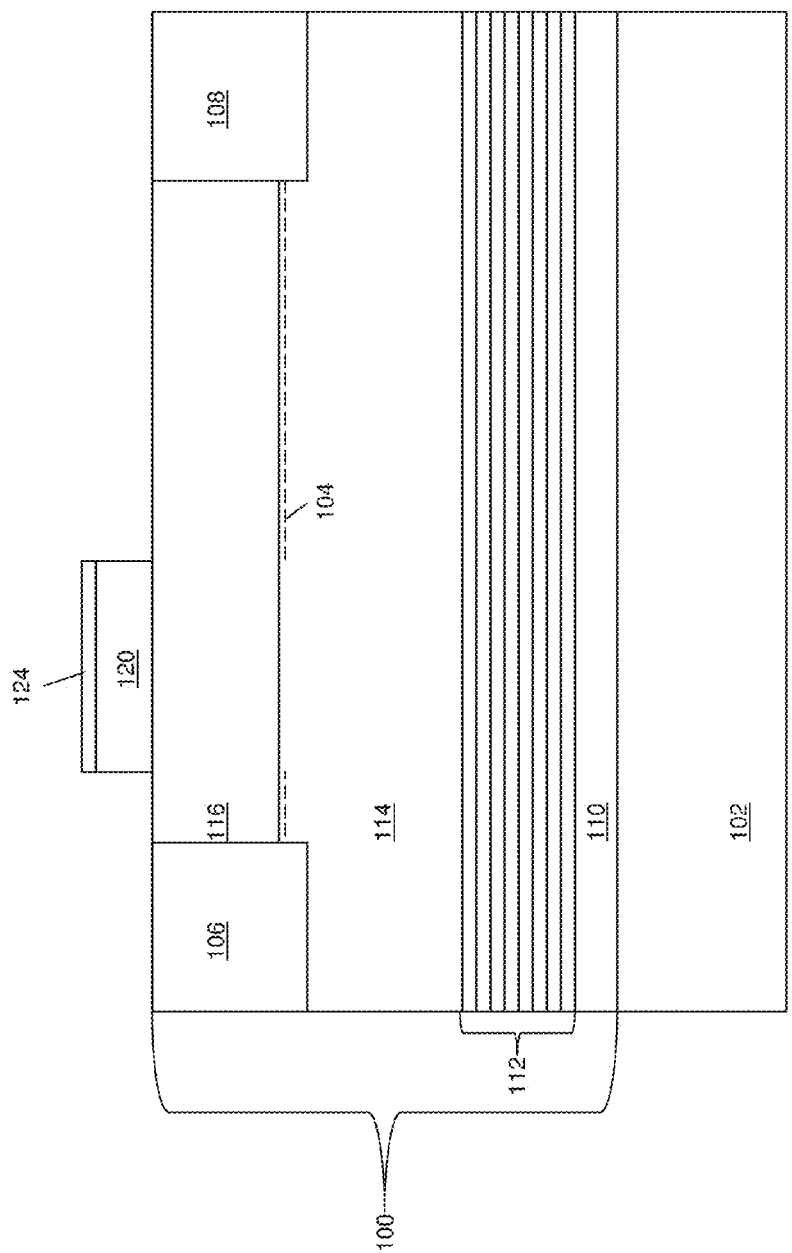
FIG. 6 illustrates a cross-sectional view of yet another embodiment of a stress-controlled heterostructure semiconductor device.

FIG. 6 illustrates a cross-sectional view of another embodiment of an HFET which is similar to the embodiment shown in FIG. 1, however the piezoelectric gate 120 is in direct contact with the heterostructure body 100. According to this embodiment, a thin film piezoelectric material is deposited directly in contact with the GaN alloy barrier layer 116 to form the piezoelectric gate 120. This way, the piezoelectric gate 120 is formed in closer proximity to the 2DEG/2DHG channel 104 and the effect of the force applied by the piezoelectric gate 120 on the channel 104 is enhanced.

FIG. 7 illustrates a cross-sectional view of yet another embodiment of an HFET which is similar to the embodiment shown in FIG. 1, however the piezoelectric gate 120 is disposed in a recess 126 in the heterostructure body 100. The recess 126 can be formed by etching into the GaN alloy barrier layer 116. A piezoelectric material is then deposited in the recess 126 to form the gate 120 and an electrically conductive material is deposited on the piezoelectric material to form the gate electrode 124. The recess 126 need not necessarily be controlled with high precision as in conventional recess approaches since the transistor threshold voltage is not precisely controlled by the recess depth. Instead, the depth of the recess 126 merely enhances the effect of the piezoelectric gate 120 by positioning the gate 120 closer to the channel 104.

The HFETs shown in FIGS. 5-7 are illustrated as being normally-off as indicated by the break in the dashed line representing the channel 104, but instead can be normally-on by forming the piezoelectric gate 120 on the heterostructure body 100 with an orientation such that the gate 120 imparts a force on the underlying GaN alloy barrier layer 116 which counteracts the built-in stress in the barrier layer 116 when no voltage is applied to the gate 120 as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a semiconductor device, the method comprising:
   providing a heterostructure body with a first doped region, a second doped region spaced apart from the first doped region and a two-dimensional charge carrier gas channel between the first and second doped regions; and
   forming a gate structure on the heterostructure body for controlling the channel, the gate structure comprising a piezoelectric material and an electrical conductor in contact with the piezoelectric material, wherein the heterostructure body has a built-in stress induced by lattice mismatch between different layers of the heterostructure body, and wherein the piezoelectric material is formed on the heterostructure body with an orientation that counteracts the built-in stress in the heterostructure body so that the channel is disrupted below the piezoelectric material absent a voltage applied to the piezoelectric material.

2. The method of claim 1, further comprising forming a passivation layer on the heterostructure body before the gate structure is formed so that the passivation layer is interposed between the heterostructure body and the piezoelectric material after the gate structure is formed.

3. The method of claim 1, wherein forming the gate structure on the heterostructure body comprises:
   depositing zinc oxide or a piezoelectric ternary compound on the heterostructure body; and
   depositing an electrically conductive material on the zinc oxide or the piezoelectric ternary compound.

4. The method of claim 1, wherein forming the gate structure on the heterostructure body comprises:
   forming a recess in the heterostructure body;
   depositing the piezoelectric material in the recess; and
   depositing an electrically conductive material on the piezoelectric material.

5. The method of claim 1, wherein the piezoelectric material is formed on the heterostructure body with an orientation that increases the built-in stress in the heterostructure body responsive to a voltage applied to the piezoelectric material.

6. The method of claim 1, wherein the heterostructure body comprises a GaN alloy layer on a GaN layer, and wherein the two-dimensional charge carrier gas channel is a two-dimensional electron channel near an interface between the GaN alloy layer and the GaN layer.

7. The method of claim 6, wherein the GaN alloy layer is an AlGaN layer having a thickness of at least 10 nm, and wherein the piezoelectric material is 100 nm or less thick.

8. The method of claim 6, wherein the GaN alloy layer has a uniform thickness.

9. A method of manufacturing a semiconductor device, the method comprising:
   providing a heterostructure body with a first doped region, a second doped region spaced apart from the first doped region and a two-dimensional charge carrier gas channel between the first and second doped regions; and
   forming a gate structure on the heterostructure body for controlling the channel, the gate structure comprising a piezoelectric material and an electrical conductor in contact with the piezoelectric material, wherein the gate structure is configured to control the channel below the piezoelectric material such that:
   (a) the two-dimensional charge carrier gas channel is uninterrupted below the piezoelectric material absent a voltage applied to the piezoelectric material; and
   (b) the piezoelectric material generates a force in response to a voltage applied to the piezoelectric material, the force being transferred to the heterostructure body to disrupt the two-dimensional charge carrier gas channel below the piezoelectric material.

10. The method of claim 9, further comprising forming a passivation layer on the heterostructure body before the gate structure is formed so that the passivation layer is interposed between the heterostructure body and the piezoelectric material after the gate structure is formed.

11. The method of claim 9, wherein forming the gate structure on the heterostructure body comprises:
   depositing zinc oxide or a piezoelectric ternary compound on the heterostructure body; and
   depositing an electrically conductive material on the zinc oxide or the piezoelectric ternary compound.

12. The method of claim 9, wherein the piezoelectric material is formed on the heterostructure body with an orientation that increases the built-in stress in the heterostructure body responsive to a voltage applied to the piezoelectric material.

13. The method of claim 9, wherein the heterostructure body comprises a GaN alloy layer on a GaN layer, and wherein the two-dimensional charge carrier gas channel is a two-dimensional electron channel near an interface between the GaN alloy layer and the GaN layer.

14. The method of claim 13, wherein the GaN alloy layer is an AlGaN layer having a thickness of at least 10 nm, and wherein the piezoelectric material is 100 nm or less thick.

15. The method of claim 13, wherein the GaN alloy layer has a uniform thickness.

* * * * *